US012768593B2

(12) United States Patent
Park et al.

(10) Patent No.: US 12,768,593 B2
(45) Date of Patent: Oct. 20, 2026

(54) SUBSTRATE PROCESSING APPARATUS AND METHOD OF PROCESSING A SUBSTRATE USING THE SAME

(71) Applicant: Samsung Electronics Co., Ltd., Suwon-si (KR)

(72) Inventors: Sangjine Park, Suwon-si (KR); Ji Hwan Park, Suwon-si (KR); Kuntack Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 699 days.

(21) Appl. No.: 18/095,125

(22) Filed: Jan. 10, 2023

(65) Prior Publication Data

US 2023/0400252 A1 Dec. 14, 2023

(30) Foreign Application Priority Data

Jun. 14, 2022 (KR) ........................ 10-2022-0072286

(51) Int. Cl.

| | |
|---|---|
| ***H01L 21/67*** | (2006.01) |
| ***F26B 3/04*** | (2006.01) |
| ***F26B 5/00*** | (2006.01) |
| ***F26B 5/04*** | (2006.01) |
| ***F26B 9/06*** | (2006.01) |
| ***F26B 21/10*** | (2006.01) |
| ***F26B 21/14*** | (2006.01) |
| *G03F 7/20* | (2006.01) |
| *H10P 70/00* | (2026.01) |

(52) U.S. Cl.

CPC ................ *F26B 5/005* (2013.01); *F26B 5/04* (2013.01); *G03F 7/2024* (2013.01); *H10P 70/20* (2026.01)

(58) Field of Classification Search

CPC .... F26B 5/005; F26B 5/04; F26B 3/04; F26B 9/06; F26B 21/10; F26B 21/14; H01L 21/67017; H01L 21/67034; H01L 21/67005

USPC ....................... 34/357, 72, 402; 134/26, 94.1

See application file for complete search history.

(56) References Cited

U.S. PATENT DOCUMENTS

| | | | | |
|---|---|---|---|---|
| 6,871,656 | B2 * | 3/2005 | Mullee .................... | G03F 7/422 257/E21.255 |
| 7,262,422 | B2 | 8/2007 | Subramanian et al. | |
| 7,485,611 | B2 | 2/2009 | Roeder et al. | |
| 8,026,047 | B2 | 9/2011 | Namatsu et al. | |
| 8,349,549 | B2 | 1/2013 | Maemori et al. | |
| 10,197,333 | B2 | 2/2019 | Kim et al. | |
| 10,347,511 | B2 * | 7/2019 | Verhaverbeke ..... | H10P 72/0408 |
| 2002/0014257 | A1 | 2/2002 | Chandra et al. | |
| 2003/0051741 | A1 * | 3/2003 | DeSimone ............ | B08B 7/0021 257/E21.228 |
| 2006/0003271 | A1 | 1/2006 | Clark et al. | |

(Continued)

FOREIGN PATENT DOCUMENTS

| | | |
|---|---|---|
| KR | 101681190 B1 | 12/2016 |
| KR | 20170006570 A | 1/2017 |

*Primary Examiner* — Deming Wan

(74) *Attorney, Agent, or Firm* — Muir Patent Law, PLLC

(57) ABSTRACT

A method of processing a substrate includes disposing a substrate in a drying chamber, and supplying a fluid into the drying chamber in which the substrate is disposed. The supplying of the fluid into the drying chamber includes supplying a gas into the drying chamber, and supplying a supercritical fluid into the drying chamber after the supplying of the gas is started.

20 Claims, 15 Drawing Sheets

(56) References Cited

U.S. PATENT DOCUMENTS

| | | | |
|---|---|---|---|
| 2006/0065189 A1 | 3/2006 | Babic et al. | |
| 2011/0214694 A1* | 9/2011 | Toshima | H01L 21/67017 134/21 |
| 2013/0061492 A1* | 3/2013 | Okuchi | F26B 7/00 34/402 |
| 2015/0170945 A1 | 6/2015 | Segawa et al. | |
| 2019/0355574 A1* | 11/2019 | Kanno | H01L 21/67028 |
| 2020/0047224 A1* | 2/2020 | Fukui | H01L 21/67017 |

* cited by examiner

SUBSTRATE PROCESSING APPARATUS AND METHOD OF PROCESSING A SUBSTRATE USING THE SAME

CROSS-REFERENCE TO RELATED APPLICATIONS

This U.S. non-provisional patent application claims priority under 35 U.S.C. § 119 to Korean Patent Application No. 10-2022-0072286, filed on Jun. 14, 2022, in the Korean Intellectual Property Office, the entire contents of which are hereby incorporated by reference.

BACKGROUND OF THE INVENTION

The present disclosure relates to a substrate processing apparatus and a method of processing a substrate using the same, and more particularly, to a substrate processing apparatus capable of controlling a pressure in a drying chamber and a method of processing a substrate using the same.

A semiconductor device may be manufactured by various processes. For example, the semiconductor device may be manufactured by a photolithography process, an etching process, a deposition process, and a plating process. In the photolithography process for manufacturing the semiconductor device, a wetting process of applying liquid (e.g., a developing solution) onto a wafer may be performed. In addition, a drying process of removing the liquid, applied on the wafer, from the wafer may be performed. Various methods may be used to apply the liquid onto the wafer and/or to remove the liquid from the wafer.

SUMMARY

Embodiments of the inventive concepts may provide a substrate processing apparatus capable of easily controlling a pressure in a drying chamber, and a method of processing a substrate using the same.

Embodiments of the inventive concepts may also provide a substrate processing apparatus capable of continuously increasing a pressure in a drying chamber, and a method of processing a substrate using the same.

Embodiments of the inventive concepts may further provide a substrate processing apparatus capable of preventing damage of a substrate, and a method of processing a substrate using the same.

Embodiments of the inventive concepts may further provide a substrate processing apparatus capable of improving cleaning efficiency of a substrate, and a method of processing a substrate using the same.

According to an aspect of the present disclosure, a method of processing a substrate may include disposing a substrate in a drying chamber, and supplying a fluid into the drying chamber in which the substrate is disposed. The supplying of the fluid into the drying chamber may include supplying a gas into the drying chamber, and supplying a supercritical fluid into the drying chamber after the supplying of the gas is started.

According to an aspect of the present disclosure, a method of processing a substrate may include wet-processing a substrate, and dry-processing the substrate wet-processed. The dry-processing of the substrate may include disposing the substrate in a drying chamber, supplying a gas into the drying chamber to bring a pressure in the drying chamber to a first pressure, and supplying a supercritical fluid into the drying chamber after the pressure in the drying chamber is the first pressure.

According to an aspect of the present disclosure, a substrate processing apparatus may include a drying chamber, a supercritical fluid supply unit configured to supply a supercritical fluid into the drying chamber, and a gas supply unit configured to supply a gas into the drying chamber. The drying chamber may include a drying chamber housing providing a drying space, and a drying chuck in the drying chamber housing.

DETAILED DESCRIPTION

Figure 1:
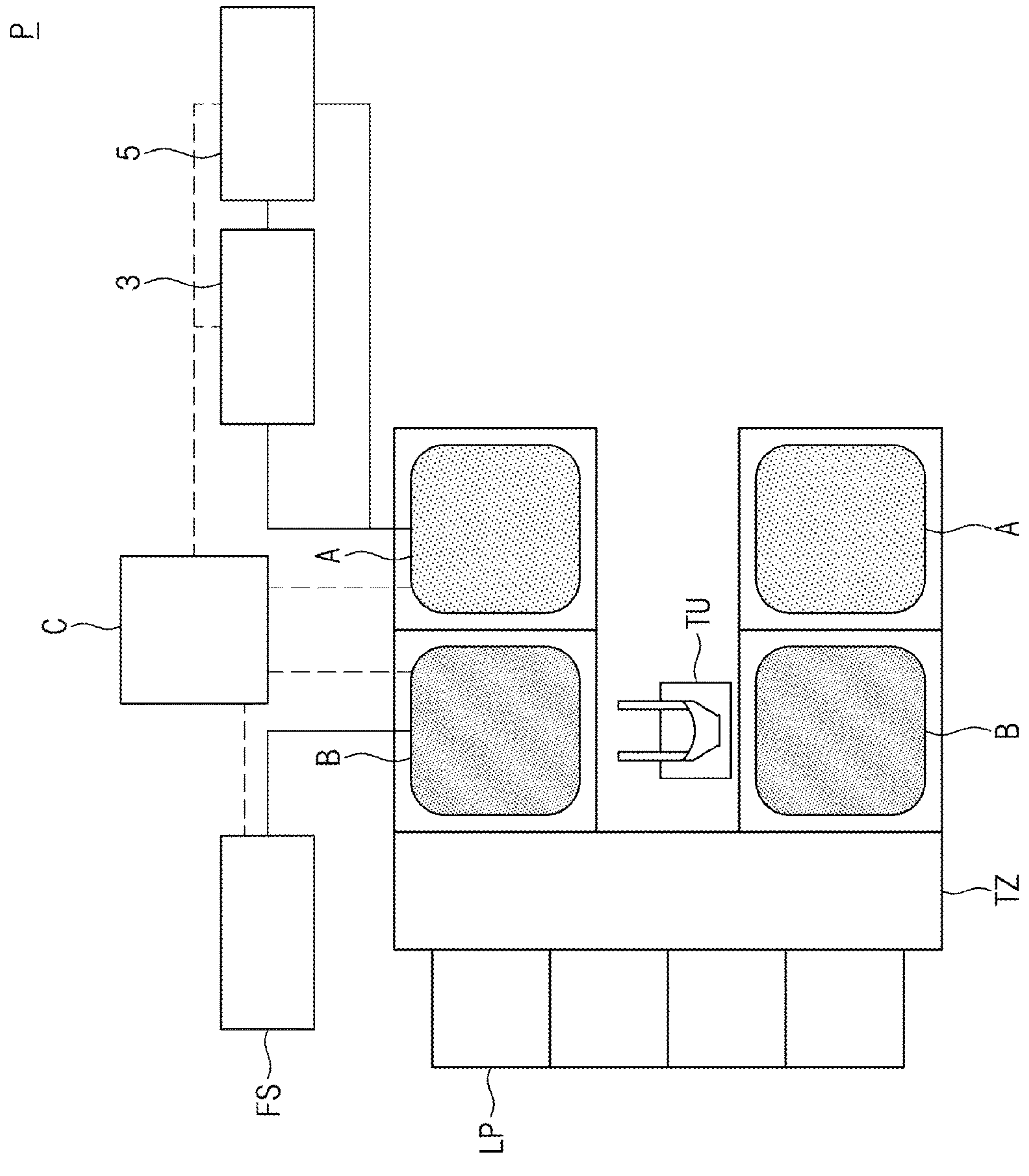
FIG. 1 is a schematic view illustrating a substrate processing apparatus according to some embodiments of the inventive concepts.

Hereinafter, embodiments of the inventive concepts will be described in detail with reference to the accompanying drawings. The same reference numerals or the same reference designators may denote the same components or elements throughout the specification.

FIG. 1 is a schematic view illustrating a substrate processing apparatus according to some embodiments of the inventive concepts.

Referring to FIG. 1, a substrate processing apparatus P may be provided. The substrate processing apparatus P may be an apparatus of processing a substrate in a semiconductor manufacturing process. More particularly, the substrate processing apparatus P may be an apparatus of performing a wetting process and a drying process on a substrate. In other words, the substrate processing apparatus P may be configured to wet a substrate by supplying or spraying liquid onto the substrate and/or may be configured to dry and clean the substrate by removing the liquid on the substrate from the substrate. For example, the substrate processing apparatus P may be configured to supply or spray a developing solution onto a substrate on which an extreme ultraviolet (EUV) exposure process was performed. In addition, the substrate processing apparatus P may be configured to dry the developing solution on the substrate. The wetting process refers to a process in which the substrate is uniformly coated with liquid. The term 'substrate' used in the present specification may mean a semiconductor wafer. The semiconductor wafer may include, but not limited to, a silicon (Si) wafer. The substrate processing apparatus P may include a loading port LP, a transfer zone TZ, a wet chamber B, a wetting solution supply unit FS, a transfer unit TU, a drying chamber A, a gas supply unit 5, a supercritical fluid supply unit 3, and a control unit C.

The loading port LP may be a port on which a substrate is loaded. For example, a substrate on which various semiconductor manufacturing processes were performed may be loaded on the loading port LP. The loading port LP may be provided in plurality. A plurality of substrates may be loaded on each of the plurality of loading ports LP. However, a single loading port LP will be described hereinafter for the purpose of ease and convenience in explanation.

The transfer zone TZ may be a zone used to move or transfer a substrate loaded on the loading port LP. For example, the transfer unit TU may be configured to transfer the substrate loaded on the loading port LP into the wet chamber B and/or the drying chamber A. The transfer zone TZ may cover the plurality of loading ports LP. For example, the transfer zone TZ may move or transfer a substrate loaded on each of the plurality of loading ports LP.

The wet chamber B may be a chamber for performing a wetting process on a substrate. The wet chamber B may provide a space in which the wetting process is performed. When a substrate is disposed in the wet chamber B, liquid (e.g., various chemicals and/or IPA) may be coated or applied onto the substrate. The coating of the liquid may be performed by various methods. For example, the liquid may be supplied or sprayed onto a rotating substrate, and thus the liquid may be uniformly distributed on the substrate by a centrifugal force generated by the rotation of the substrate. The wet chamber B may be provided in plurality. For example, two wet chambers B may be provided. The two wet chambers B may be provided to face each other. However, a single wet chamber B will be described hereinafter for the purpose of ease and convenience in explanation. The wet chamber B will be described later in more detail with reference to FIG. 2.

The wetting solution supply unit FS may be configured to supply a fluid into the wet chamber B. To achieve this, the wetting solution supply unit FS may include a fluid tank and a pump. The fluid supplied into the wet chamber B by the wetting solution supply unit FS may be referred to as a wetting solution. The wetting solution may include various chemicals and/or water. More particularly, the wetting solution may include a developing solution or isopropyl alcohol (IPA).

The transfer unit TU may be configured to transfer a substrate. For example, the transfer unit TU may transfer the substrate loaded on the loading port LP into the wet chamber B through the transfer zone TZ. In addition, the transfer unit TU may take the substrate out of the wet chamber B and then may transfer the substrate into the drying chamber A. To achieve this, the transfer unit TU may include an actuator (e.g., a motor) and a robot arm actuated by the actuator. The transfer unit TU may pick up the substrate in the wet chamber B and transfer the substrate into the drying chamber A using the robot arm. A single transfer unit TU may be provided, but embodiments of the inventive concepts are not limited thereto.

The drying chamber A may be a chamber for drying a substrate. For example, the drying chamber A may be configured to dry and/or clean the substrate which has passed through the wet chamber B. In other words, the drying chamber A may remove the liquid from the substrate coated with the developing solution and/or IPA in the wet chamber B. The drying chamber A may provide a space in which the drying process is performed. The drying chamber A may be provided in plurality. For example, two drying chambers A may be provided. The two drying chambers A may be provided to face each other. However, a single drying chamber A will be described for the purpose of ease and convenience in explanation.

The gas supply unit 5 may be configured to supply a fluid into the drying chamber A. More particularly, the gas supply unit 5 may be configured to supply a gas into the drying chamber A. For example, the gas supply unit 5 may supply carbon dioxide ($CO_2$) in a gaseous state into the drying chamber A. However, embodiments of the inventive concepts are not limited thereto, and in certain embodiments, the gas supply unit 5 may supply another kind of a gas. The gas supply unit 5 may be connected to each of the plurality of drying chambers A. In addition, the gas supply unit 5 may be connected to another kind of a chamber. The gas supply unit 5 will be described later in more detail with reference to FIG. 4.

The supercritical fluid supply unit 3 may be configured to supply a fluid into the drying chamber A. More particularly, the supercritical fluid supply unit 3 may be configured to supply a supercritical fluid into the drying chamber A. A material of the supercritical fluid supplied by the supercritical fluid supply unit 3 may be substantially the same or similar as a material of the gas supplied by the gas supply unit 5. For example, the supercritical fluid supply unit 3 may supply carbon dioxide ($CO_2$) in a supercritical state into the drying chamber A. The supercritical fluid supply unit 3 will be described later in more detail with reference to FIG. 4.

The control unit C may control the wet chamber B and the drying chamber A. For example, the control unit C may control the supercritical fluid supply unit 3 to adjust a degree of drying of a substrate. More particularly, the control unit C may control a flow rate of a fluid supplied into the drying chamber A. This will be described later in more detail.

Figure 2:
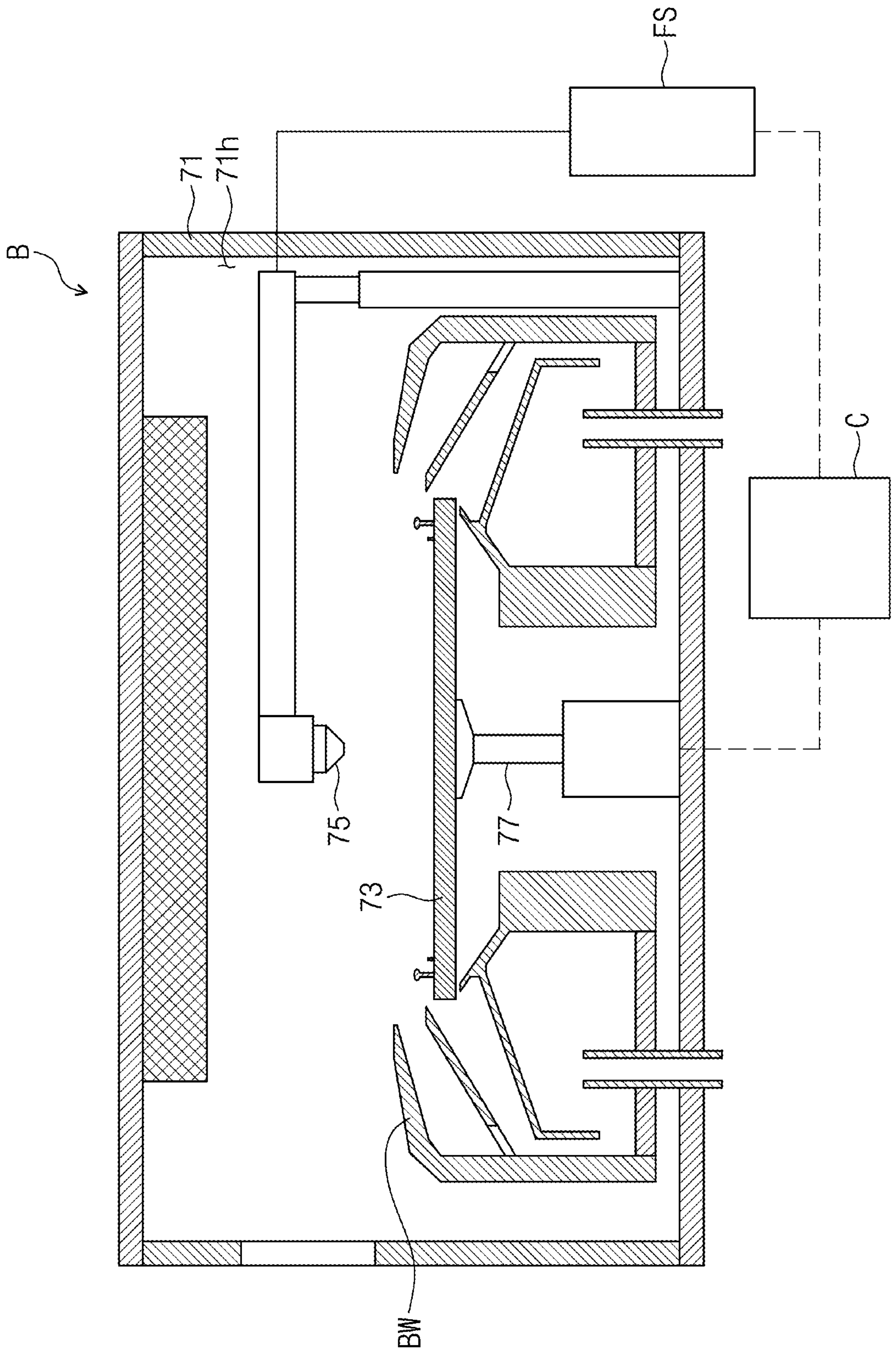
FIG. 2 is a cross-sectional view illustrating a wet chamber according to some embodiments of the inventive concepts.

FIG. 2 is a cross-sectional view illustrating a wet chamber according to some embodiments of the inventive concepts.

Referring to FIG. 2, the wet chamber B may include a wet chamber housing 71, a wetting stage 73, a wetting nozzle 75, a rotation shaft 77, and a bowl BW.

The wet chamber housing 71 may provide a wetting space 71*h*. The wetting process may be performed on a substrate in a state in which the substrate is disposed in the wetting space 71*h*.

The wetting stage 73 may be located in the wet chamber housing 71. The wetting stage 73 may be configured to support a substrate. In other words, a substrate inserted in the wet chamber housing 71 may be disposed on the wetting stage 73. The wetting stage 73 may be configured to rotate a substrate.

The wetting nozzle 75 may be spaced upward from or disposed above the wetting stage 73. The wetting nozzle 75 may be connected to the wetting solution supply unit FS. The wetting nozzle 75 may be supplied with the wetting solution from the wetting solution supply unit FS and then may supply or spray the wetting solution toward the wetting stage 73.

The rotation shaft 77 may be configured to rotate the wetting stage 73 in response to a control signal of the control unit C. A substrate on the wetting stage 73 may be rotated by the rotation shaft 77.

The bowl BW may surround the wetting stage 73. The bowl BW may collect the wetting solution escaping or scattered from the wetting stage 73 to the outside.

Figure 3:
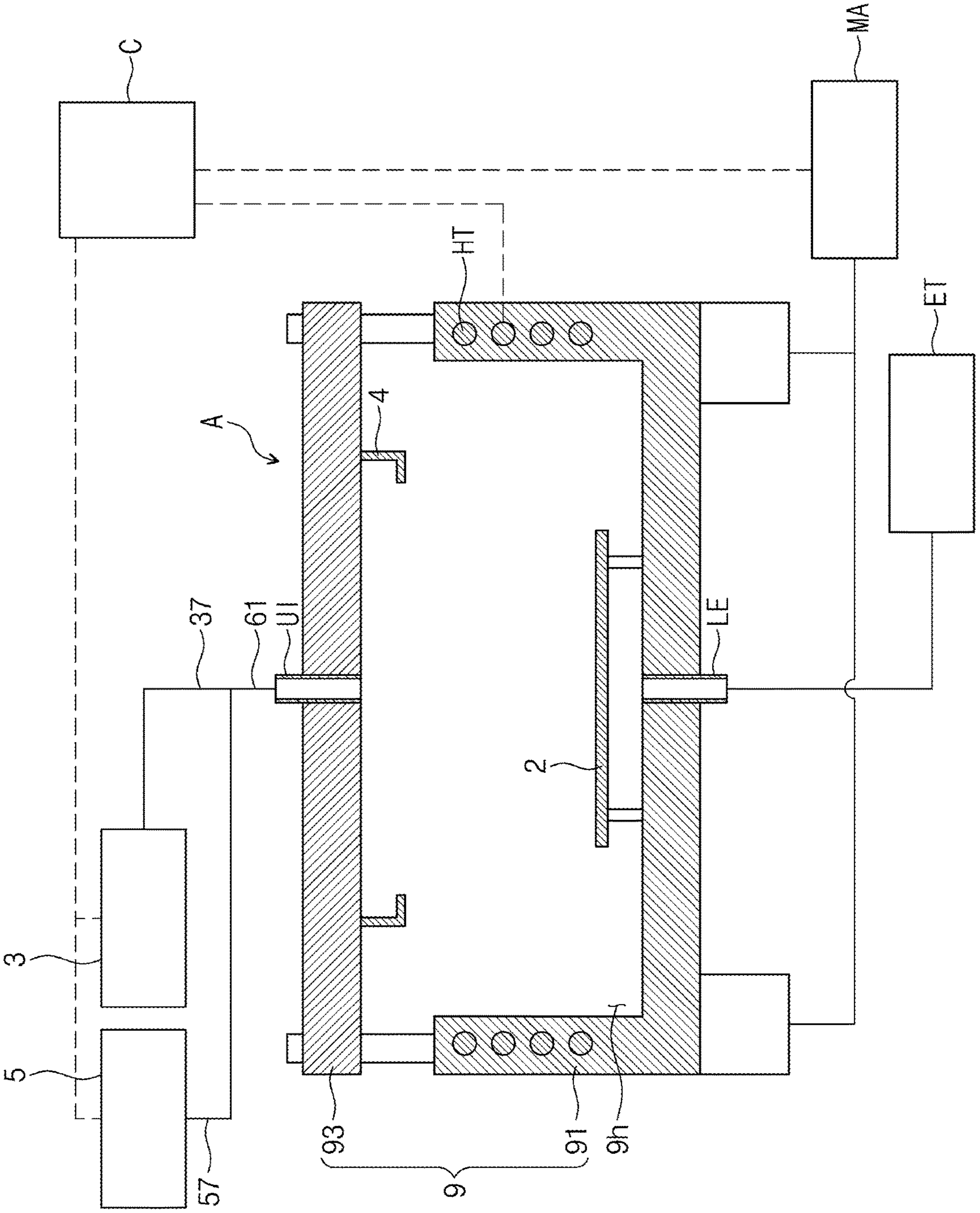
FIG. 3 is a cross-sectional view illustrating a drying chamber according to some embodiments of the inventive concepts.

FIG. 3 is a cross-sectional view illustrating a drying chamber according to some embodiments of the inventive concepts.

Referring to FIG. 3, the drying chamber A may be configured to dry a substrate. More particularly, liquid on a substrate may be removed from the substrate in the drying chamber A. A substrate wetted in the wet chamber B (see FIG. 2) may be dried in the drying chamber A. The drying chamber A may include a drying chamber housing 9, a drying heater HT, a drying chuck 4, a blocking plate 2, a chamber driving unit MA, and an exhaust tank ET.

The drying chamber housing 9 may provide a drying space 9*h*. The drying chamber housing 9 may include a lower chamber 91 and an upper chamber 93. The lower chamber 91 may be spaced downward from or disposed under the upper chamber 93. The drying space 9*h* may be provided between the lower chamber 91 and the upper chamber 93. The lower chamber 91 may be vertically movable. For example, the lower chamber 91 may be moved upward by the chamber driving unit MA and thus may be coupled to the upper chamber 93. The lower chamber 91 and the upper chamber 93 may be coupled to each other to isolate the drying space 9*h* from the outside. An upper inlet UI may be provided at the upper chamber 93. The upper inlet UI may be connected to the gas supply unit 5 and/or the supercritical fluid supply unit 3. The gas may be supplied from the gas supply unit 5 into the drying space 9*h* through the upper inlet UI. In addition, the supercritical fluid may be supplied from the supercritical fluid supply unit 3 into the drying space 9*h* through the upper inlet UI. A lower outlet LE may be provided at the lower chamber 91. The lower outlet LE may be connected to the exhaust tank ET. A fluid may be released to the outside of the drying chamber housing 9 through the lower outlet LE.

The drying heater HT may be coupled to the drying chamber housing 9. In an embodiment, the drying heater HT may be buried in the drying chamber housing 9. The drying heater HT may include a resistance coil or a resistance wire as an electrical resistance. The drying heater HT may be configured to heat the drying space 9*h*. The supercritical fluid supplied in the drying space 9*h* may be maintained in a supercritical state by heating of the drying heater HT.

The drying chuck 4 may be connected to the upper chamber 93. The drying chuck 4 may be spaced downward from or disposed below the upper chamber 93. In an embodiment, the drying chuck 4 may be connected to a bottom surface of the upper chamber 93. A substrate may be disposed or placed on the drying chuck 4. In other words, the drying chuck 4 may support the substrate.

The blocking plate 2 may be connected to the lower chamber 91. The blocking plate 2 may be spaced upward from or disposed above the lower outlet LE by a certain distance. The blocking plate 2 may block the flowing of a fluid. For example, the blocking plate 2 may serve as an obstacle to flowing of the fluid in the drying chamber housing 9 toward the lower outlet LE. The chamber driving unit MA may be connected to the lower chamber 91. The chamber driving unit MA may be configured to vertically move the lower chamber 91. By the chamber driving unit MA, the lower chamber 91 may be coupled to the upper chamber 93 or may be separated from the upper chamber 93. To achieve this, the chamber driving unit MA may include an actuator (e.g., a motor). The exhaust tank ET may be connected to the lower outlet LE. The fluid released through the lower outlet LE may move to the exhaust tank ET.

Figure 4:
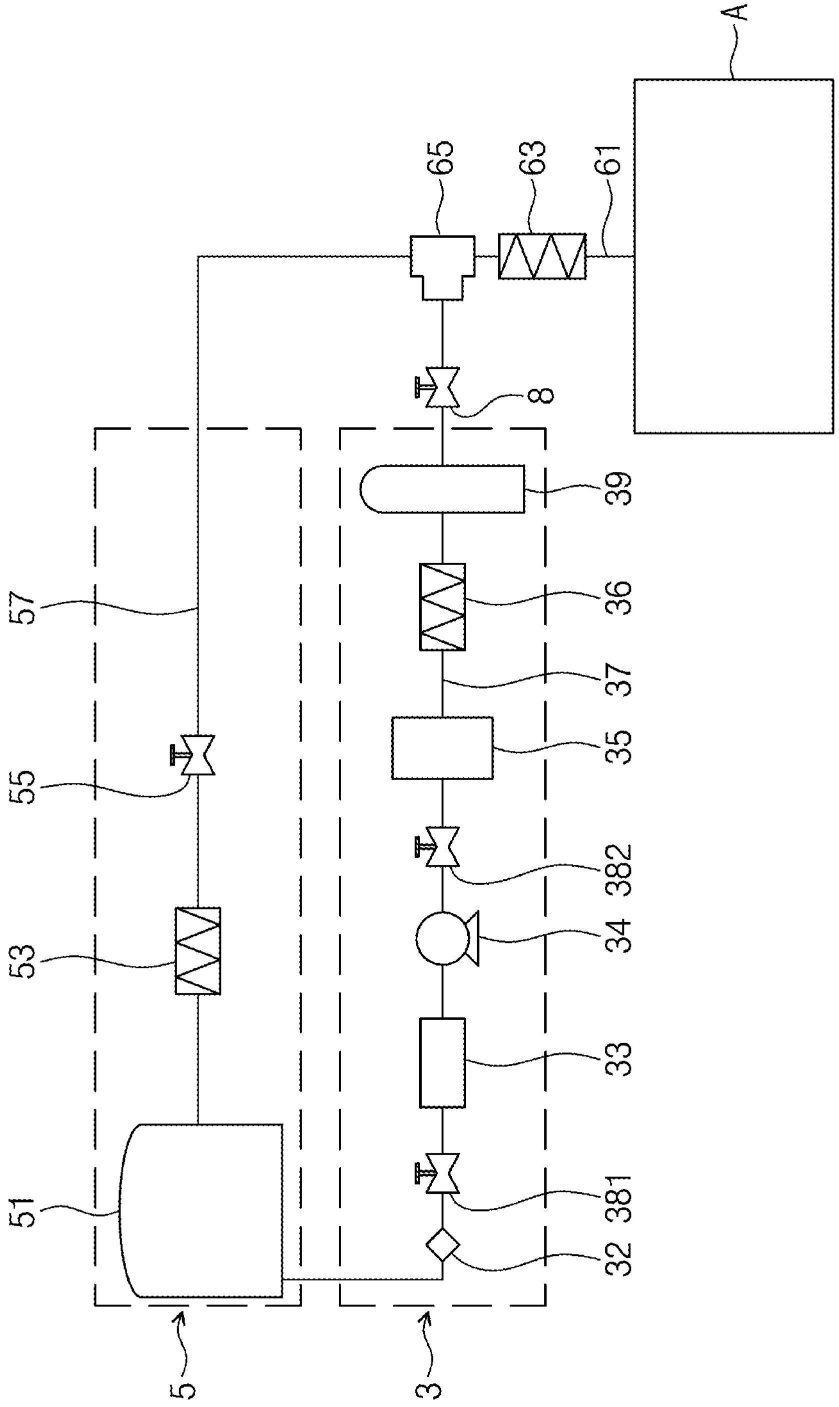
FIG. 4 is a schematic view illustrating a gas supply unit and a supercritical fluid supply unit according to some embodiments of the inventive concepts.

FIG. 4 is a schematic view illustrating a gas supply unit and a supercritical fluid supply unit according to some embodiments of the inventive concepts.

Referring to FIG. 4, a supply line 61, a supply heater 63, a connection pipe 65 and a supercritical valve 8 may further be provided.

The supply line 61 may connect the gas supply unit 5 to the drying chamber A. In addition, the supply line 61 may connect the supercritical fluid supply unit 3 to the drying chamber A. The supply line 61 may provide a path through which a fluid moves.

The supply heater 63 may be located on the supply line 61. The supply heater 63 may be configured to heat a fluid passing through the supply line 61. In an embodiment, the supply heater 63 may include a resistance coil or a resistance wire as electrical resistance. In an embodiment, the supply heater 63 may wrap the supply line 61 or extend along the supply line 61. The connection pipe 65 may connect a gas line 57 to the supply line 61. In addition, the connection pipe 65 may connect a supercritical fluid line 37 to the supply line 61. The supercritical valve 8 may be located on the supercritical fluid line 37. Movement of the supercritical fluid may be controlled by opening/closing of the supercritical valve 8.

The gas supply unit 5 may be configured to supply the gas into the drying chamber A. For example, the gas supply unit 5 may supply carbon dioxide ($CO_2$) in a gaseous state into the drying chamber A. To achieve this, the gas supply unit 5 may include the gas line 57, a gas tank 51, a gas heater 53, and a gas valve 55.

The gas line 57 may connect the gas tank 51 to the drying chamber A. The gas line 57 may provide a path through which the gas supplied from the gas tank 51 moves. In some embodiments, the gas line 57 may be connected to the drying chamber A through the supply line 61.

The gas tank 51 may be configured to store and/or supply the gas. For example, the gas tank 51 may store and/or supply carbon dioxide ($CO_2$) in a liquid state and/or a gaseous state. A temperature of the gaseous carbon dioxide ($CO_2$) supplied by the gas tank 51 may range from about 10° C. to about 30° C. In addition, a pressure of the gaseous carbon dioxide ($CO_2$) supplied by the gas tank 51 may range from about 4 MPa to about 6 MPa. The fluid (e.g., the gas) supplied from the gas tank 51 may move along the gas line 57.

The gas heater 53 may be located on the gas line 57. The gas heater 53 may be configured to heat the gas moving along the gas line 57. The gas heater 53 may include a resistance wire or a resistance coil using an electrical resistance, but embodiments of the inventive concepts are not limited thereto. The gas heater 53 may wrap the gas line 57 or may extend along the gas line 57.

The gas valve 55 may be located on the gas line 57. The gas supplied from the gas tank 51 into the drying chamber A may be controlled by opening/closing of the gas valve 55. When the gas valve 55 is open, the gas outputted from the gas tank 51 may move along the gas line 57 and then may be supplied into the drying chamber A through the supply line 61.

The supercritical fluid supply unit 3 may be connected to the drying chamber A. The supercritical fluid supply unit 3 may convert a gaseous fluid into the supercritical fluid. The supercritical fluid generated by the supercritical fluid supply unit 3 may be supplied into the drying chamber A. For example, the supercritical fluid supply unit 3 may convert carbon dioxide ($CO_2$) in a gaseous state into carbon dioxide ($CO_2$) in a supercritical state. However, embodiments of the inventive concepts are not limited thereto, and in certain embodiments, another kind of a material may be used as the supercritical fluid. Hereinafter, carbon dioxide ($CO_2$) will be described as an example for the purpose of ease and convenience in explanation. The supercritical fluid supply unit 3 may store the fluid in the supercritical state for a certain time. The supercritical fluid supply unit 3 may include the supercritical fluid line 37, a filter 32, a first valve 381, a condenser 33, a pump 34, a second valve 382, a first tank 35, a heater 36, and a second tank 39.

The supercritical fluid line 37 may provide a path for providing carbon dioxide ($CO_2$) supplied from the outside into the drying chamber A. For example, the supercritical fluid line 37 may be connected to the gas supply unit 5 so as to be supplied with carbon dioxide ($CO_2$) in the gaseous state from the gas supply unit 5. More particularly, the supercritical fluid line 37 may be connected to the gas tank 51 so as to be supplied with carbon dioxide ($CO_2$) in the gaseous state from the gas tank 51. However, embodiments of the inventive concepts are not limited thereto, and in certain embodiments, the supercritical fluid line 37 may be supplied with carbon dioxide ($CO_2$) in the gaseous state from another component, not the gas supply unit 5.

The filter 32 may be located on the supercritical fluid line 37. The filter 32 may filter a foreign material in the fluid. The first valve 381 may be configured to open/close a flow path between the filter 32 and the condenser 33 to control movement of the fluid.

The condenser 33 may be configured to cool carbon dioxide ($CO_2$) in the gaseous state. Thus, carbon dioxide ($CO_2$) in the gaseous state may be liquefied in the condenser 33. For example, a temperature of carbon dioxide ($CO_2$) liquefied in the condenser 33 may range from about 0° C. to about 6° C. In addition, a pressure of carbon dioxide ($CO_2$) liquefied in the condenser 33 may range from about 4 MPa to about 6 MPa.

The pump 34 may be configured to increase the pressure of carbon dioxide ($CO_2$) liquefied through the condenser 33. For example, the pressure of carbon dioxide ($CO_2$) liquefied in the condenser 33 may become in a range of about 15 MPa to about 25 MPa by the pump 34. In addition, the temperature of carbon dioxide ($CO_2$) liquefied in the condenser 33 may become in a range of about 15° C. to about 25° C. while passing through the pump 34. The second valve 382 may be configured to open/close a flow path between the pump 34 and the first tank 35 to control movement of the fluid. The first tank 35 may store the fluid compressed by the pump 34.

The heater 36 may be configured to heat the fluid moving along the supercritical fluid line 37. More particularly, the heater 36 may heat carbon dioxide ($CO_2$) in a liquid state, which is compressed by the pump 34. Thus, carbon dioxide ($CO_2$) in the liquid state may become in the supercritical state. Carbon dioxide ($CO_2$) in the supercritical state, which is formed by the heating of the heater 36, may be in a high-temperature and high-pressure state. For example, a temperature of carbon dioxide ($CO_2$) in the supercritical state through the heater 36 may range from about 60° C. to about 90° C. In addition, a pressure of carbon dioxide ($CO_2$) in the supercritical state through the heater 36 may range from about 15 MPa to about 25 MPa. Carbon dioxide ($CO_2$) in the supercritical state through the heater 36 may be stored in the second tank 39. Carbon dioxide ($CO_2$) in the supercritical state stored in the second tank 39 may be supplied into the drying chamber A through the supply line 61.

Figure 5:
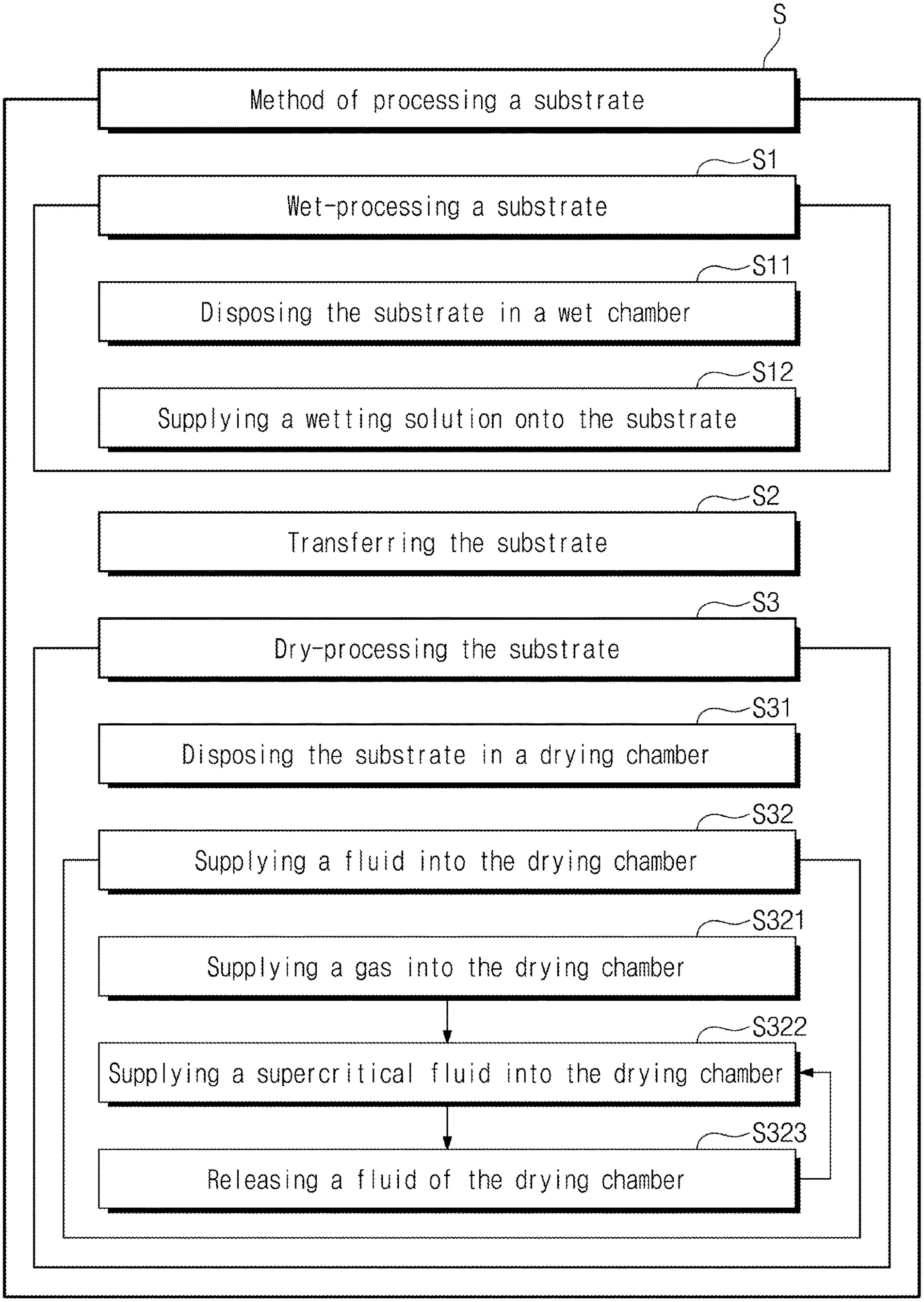
FIG. 5 is a flow chart illustrating a method of processing a substrate according to some embodiments of the inventive concepts.

FIG. 5 is a flow chart illustrating a method of processing a substrate according to some embodiments of the inventive concepts.

Referring to FIG. 5, a method of processing a substrate (S) may be provided. The method of processing a substrate (S) may be a method of processing a substrate using the substrate processing apparatus as described with reference to FIGS. 1 to 4. The method of processing a substrate (S) may include wet-processing a substrate (S1), transferring the substrate (S2), and dry-processing the substrate (S3).

The wet-processing of the substrate (S1) may include disposing the substrate in a wet chamber (S11) and supplying a wetting solution onto the substrate (S12).

The dry-processing of the substrate (S3) may include disposing the substrate in a drying chamber (S31) and supplying a fluid into the drying chamber (S32).

The supplying of the fluid into the drying chamber (S32) may include supplying a gas into the drying chamber (S321), supplying a supercritical fluid into the drying chamber (S322), and releasing a fluid of the drying chamber (S323).

Hereinafter, the method of processing a substrate (S) in FIG. 5 will be described in detail with reference to FIGS. 6 to 12.

FIGS. 6 to 12 are views illustrating the method of processing a substrate in the flow chart of FIG. 5.

Figure 6:
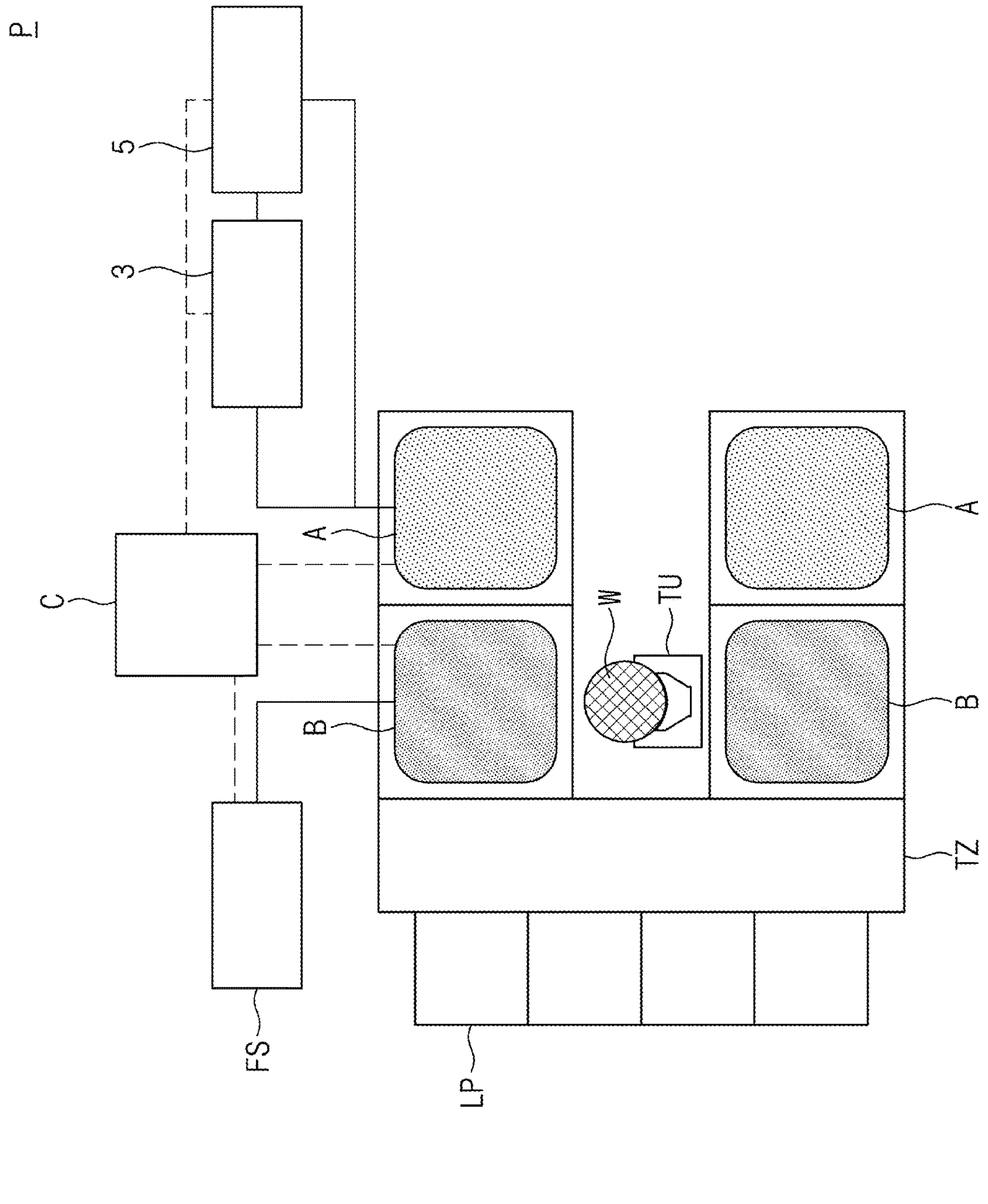
FIGS. 6 to 12 are views illustrating the method of processing a substrate in the flow chart of FIG. 5.
Figure 7:
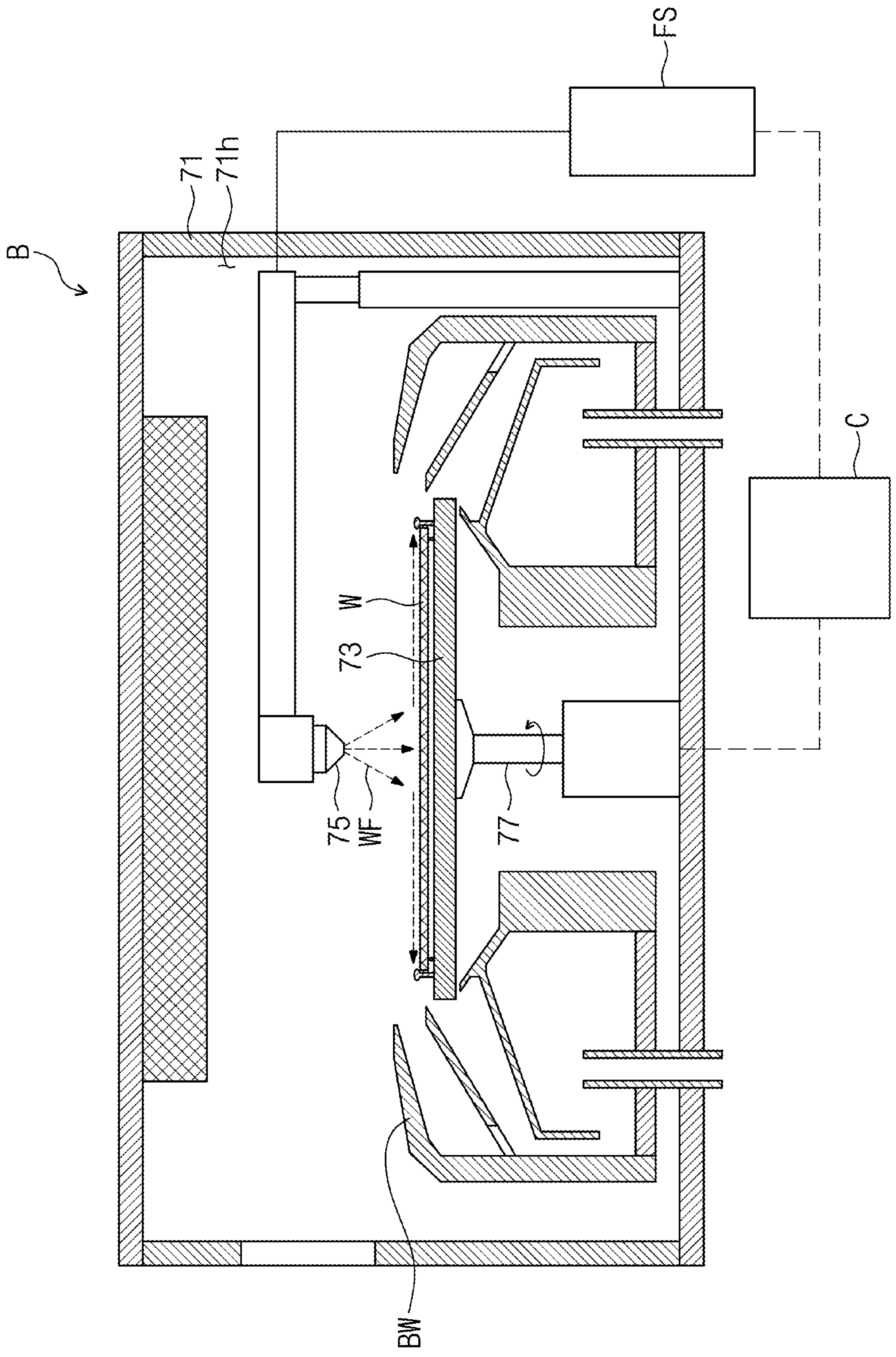

Referring to FIGS. 6, 7 and 5, the disposing of the substrate in the wet chamber (S11) may include disposing a substrate W in the wet chamber housing 71. For example, the transfer unit TU may dispose the substrate W in the wet chamber housing 71. The substrate W may be disposed on the wetting stage 73

The supplying of the wetting solution onto the substrate (S12) may include supplying a wetting solution WF onto the substrate W in a state in which the substrate W is disposed on the wetting stage 73. For example, the wetting solution WF supplied from the wetting solution supply unit FS may be supplied or sprayed onto the substrate W through the wetting nozzle 75. At this time, the substrate W may be rotated. More particularly, the wetting stage 73 may be rotated by rotation of the rotation shaft 77, and thus the substrate W may be rotated. Thus, the wetting solution WF supplied on the substrate W may be uniformly distributed on the substrate W.

Figure 8:
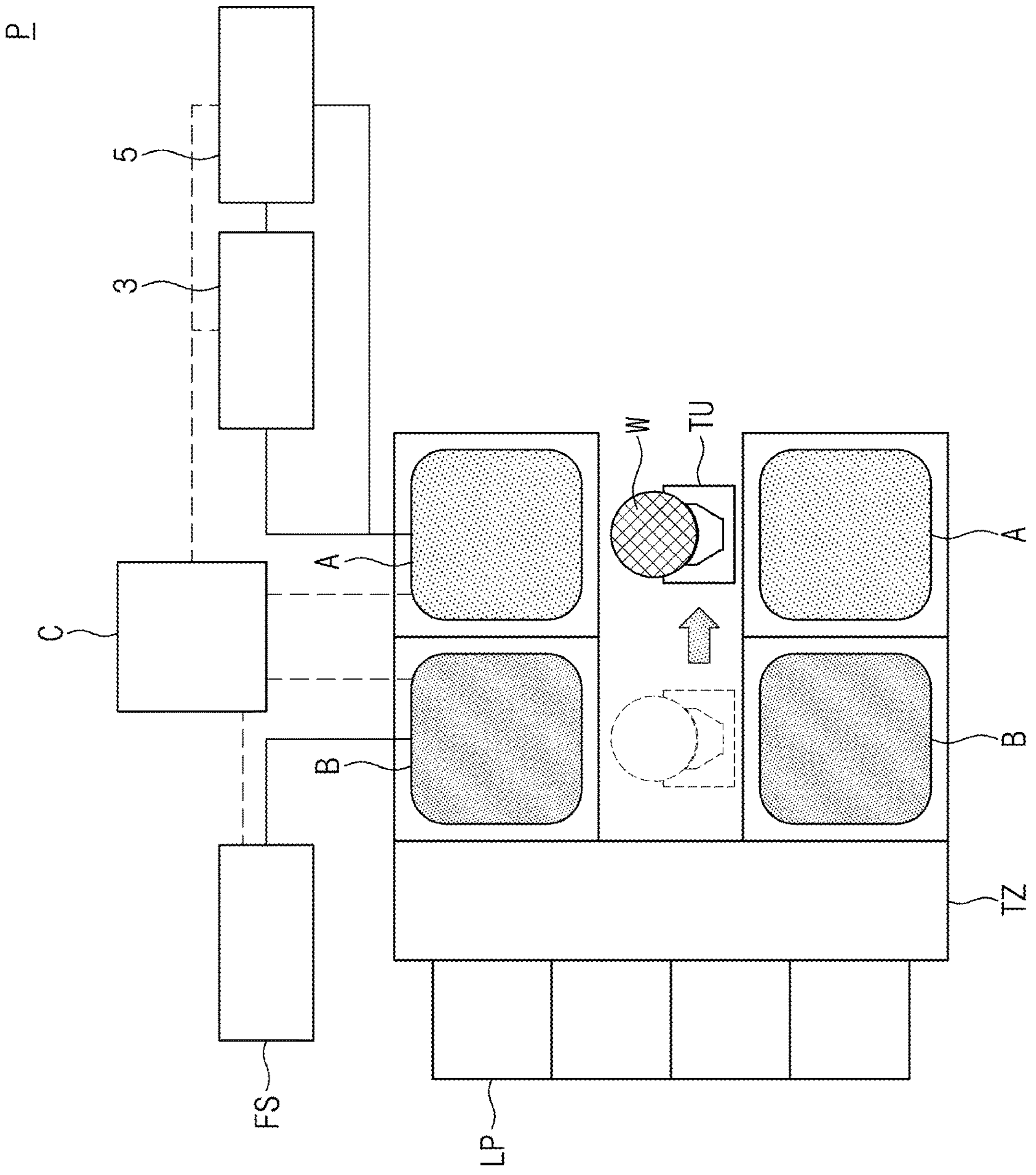

Referring to FIGS. 8 and 5, the transferring of the substrate (S2) may include transferring the substrate W into the drying chamber A after taking the substrate W out of the wet chamber B. For example, the substrate W may be transferred from the wet chamber B into the drying chamber A by the transfer unit TU.

Figure 9:
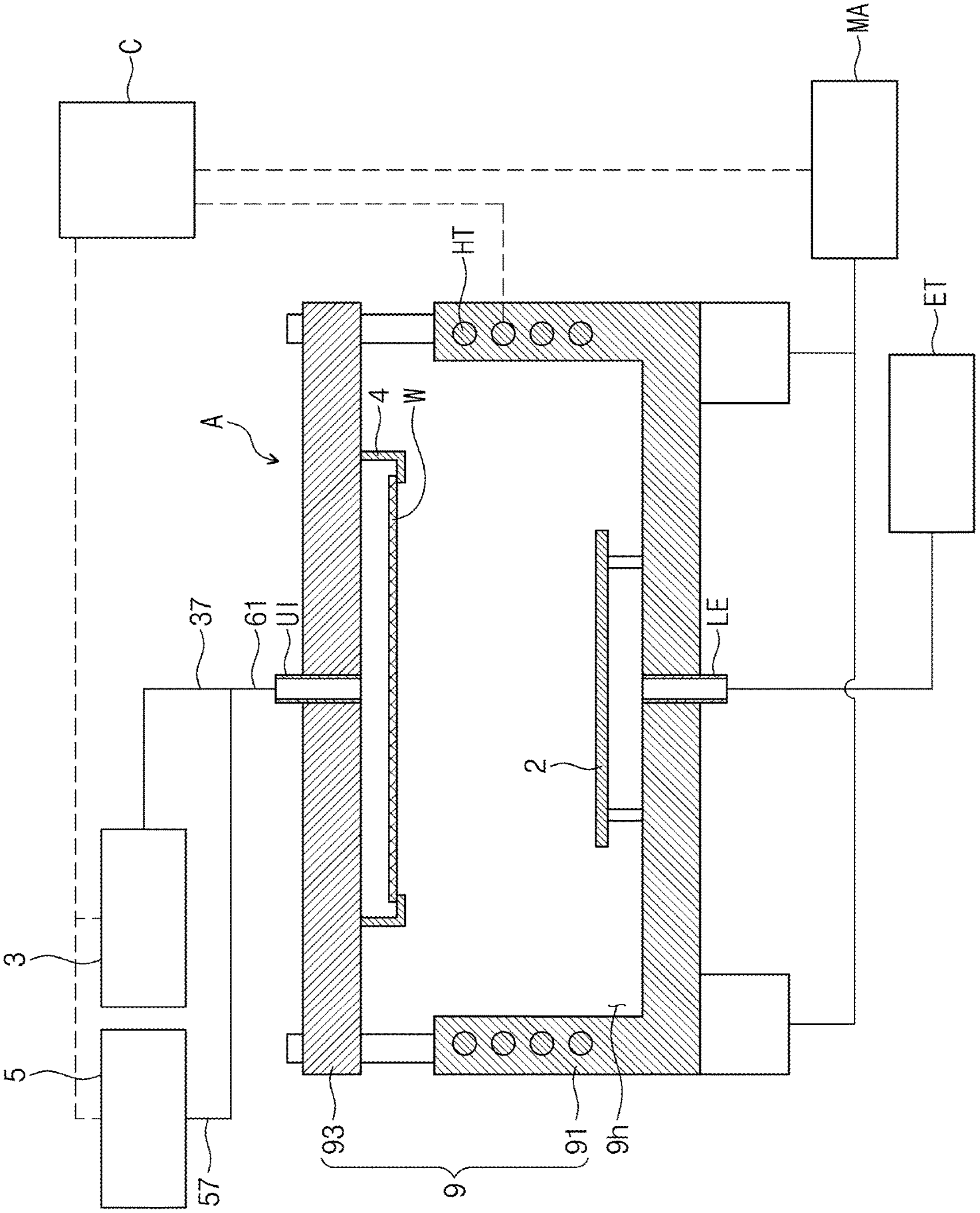

Referring to FIGS. 9 and 5, the disposing of the substrate in the drying chamber (S31) may include disposing the substrate W on the drying chuck 4. This process may be performed by the transfer unit TU (see FIG. 8) in a status where the lower chamber 91 and the upper chamber 93 are separated from each other, but embodiments of the inventive concepts are not limited thereto. The transfer unit TU may transfer the substrate into the drying chuck 4 through a gap between the lower chamber 91 and the upper chamber 93.

Figure 10:
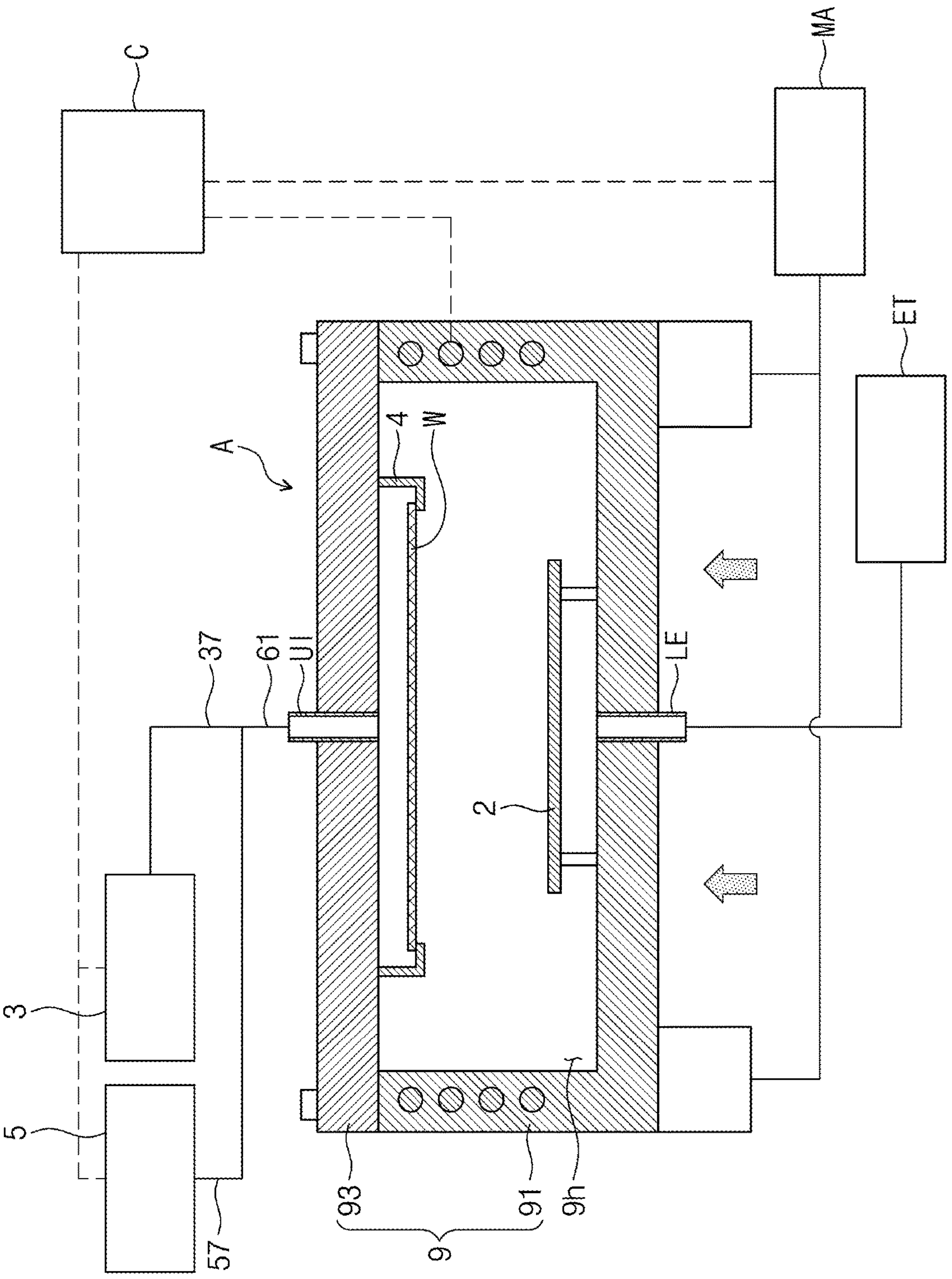

Referring to FIG. 10, the drying chamber housing 9 may be closed after the disposing of the substrate W. For example, the lower chamber 91 may be raised to be coupled to the upper chamber 93, and thus the drying space **9*h*** may be isolated from the outside.

Figure 11:
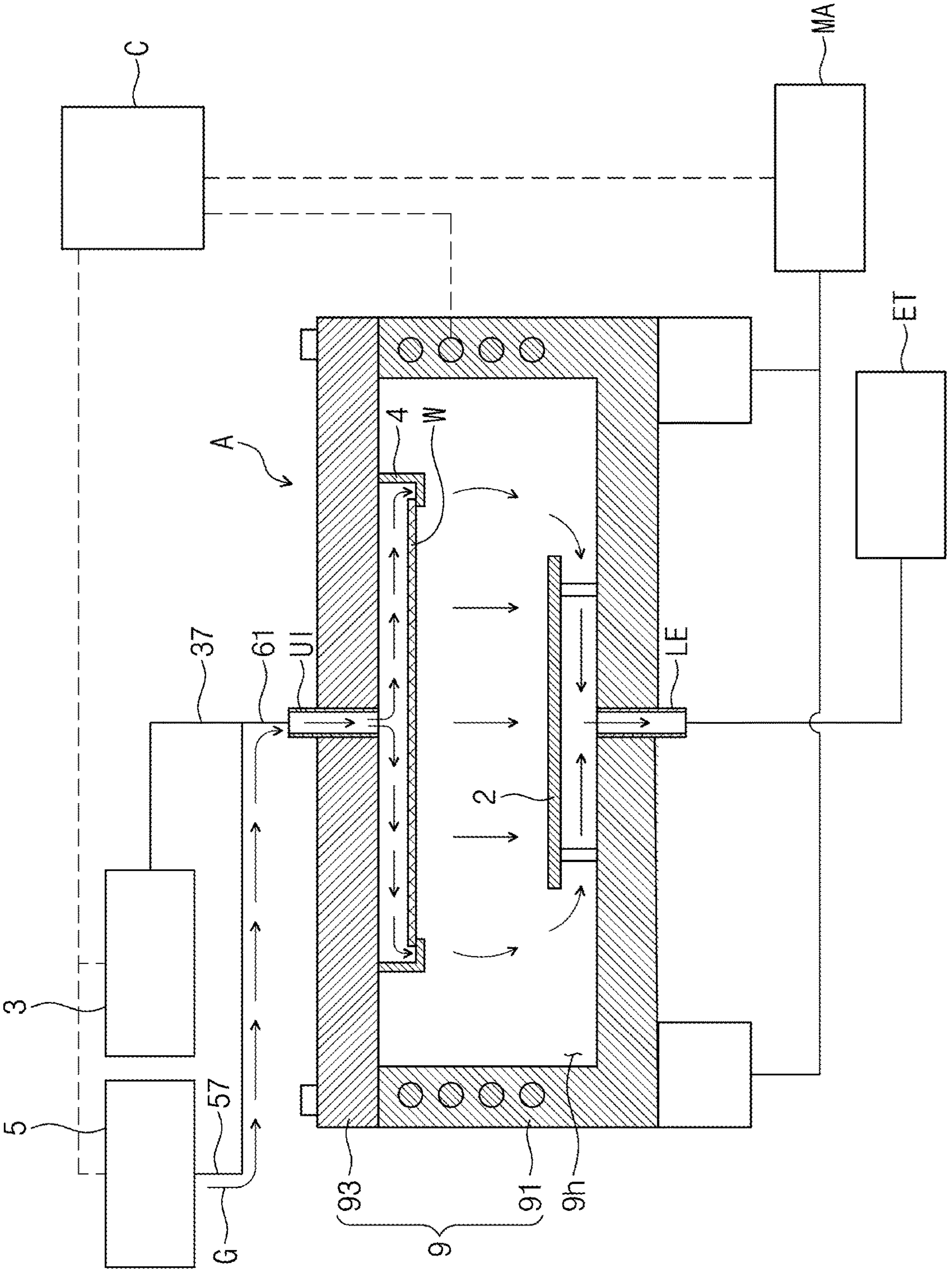

Referring to FIGS. 11 and 5, the supplying of the gas into the drying chamber (S321) may include supplying a gas G into the drying space **9*h*. For example, the gas G supplied from the gas supply unit 5 may be supplied into the drying chamber housing 9 without passing through the supercritical fluid supply unit 3. The first valve 381 may be off to prevent the gas G from flowing into the condenser 33 of the supercritical fluid supply unit 3. More particularly, the gas G supplied from the gas tank 51 (see FIG. 4) of the gas supply unit 5 may move to the upper inlet UI through the gas line 57 and the supply line 61**.

In this process, the gas G may be heated. For example, the gas G moving along the gas line 57 may be heated by the gas heater 53 (see FIG. 4) and/or the supply heater 63 (see FIG. 4). The gas G may be heated to about 45 degrees Celsius or more. More particularly, the gas G may be heated to about 50 degrees Celsius or more. A supply flow rate of the gas G may range from about 0.1 g/s to about 5 g/s. Thus, a pressure in the drying chamber A may continuously rise. For example, the pressure in the drying chamber A may linearly increase. In addition, a supply time of the gas G may range from about 16 seconds to about 50 seconds. However, embodiments of the inventive concepts are not limited to these numerical ranges, and the temperature, the supply flow rate and/or the supply time of the gas G may be changed according to an embodiment.

The gas G may be supplied into the drying chamber A, and thus the drying space 9*h* may be filled with the gas G. Thus, the pressure in the drying chamber A may rise. The gas G may increase the pressure of the drying space 9*h* to a first pressure. In other words, the gas G may be continuously supplied into the drying chamber A until the pressure in the drying chamber A is the first pressure. For example, the first pressure may range from about 10 bar to about 80 bar. More particularly, the first pressure may be about 50 bar. In other words, the gas G may be continuously supplied into the drying space 9*h* until the pressure in the drying chamber A is about 50 bar.

In some embodiments, a portion of the gas G of the drying space 9*h* may be released through the lower outlet LE while the gas G is supplied from the gas supply unit 5. The amount of the gas G released through the lower outlet LE may be less than the amount of the gas G supplied from the gas supply unit 5. Thus, the pressure in the drying chamber A may continuously rise. However, embodiments of the inventive concepts are not limited thereto, and in certain embodiments, the gas G of the drying space 9*h* may not be released while the gas G is supplied from the gas supply unit 5.

In certain embodiments, the gas G may be supplied stepwise. For example, the gas G may be supplied at a supply flow rate of about 0.1 g/s to about 0.5 g/s for a supply time of about 10 seconds to about 30 seconds. Thereafter, the gas G may be supplied at a supply flow rate of about 0.5 g/s to about 2 g/s for a supply time of about 3 seconds to about 10 seconds. Finally, the gas G may be supplied at a supply flow rate of about 2 g/s to about 5 g/s for a supply time of about 3 seconds to about 10 seconds.

Figure 12:
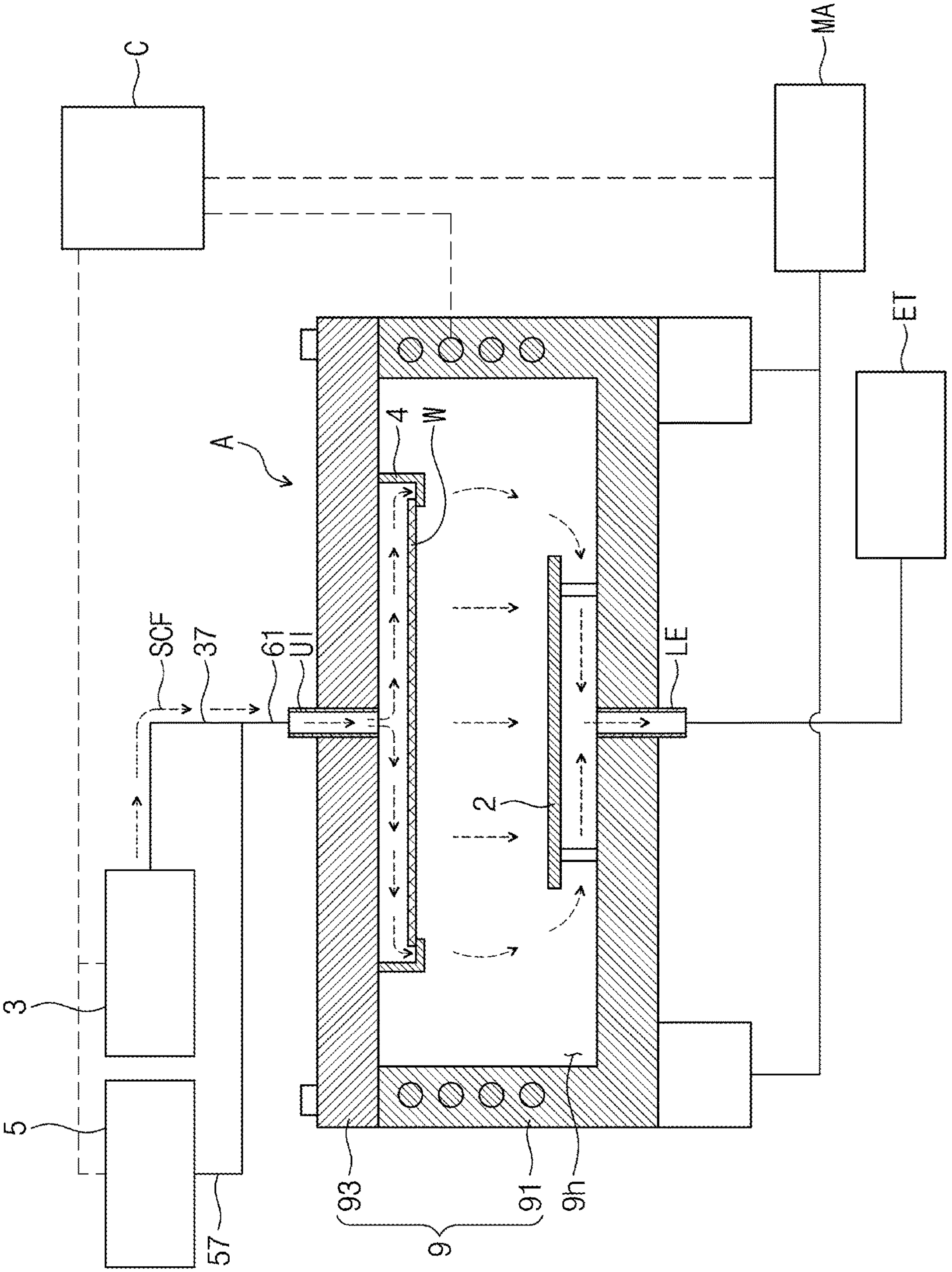

Referring to FIGS. 12 and 5, the supplying of the supercritical fluid into the drying chamber (S322) may include supplying a supercritical fluid SCF into the drying space 9*h*. The supercritical fluid SCF supplied from the supercritical fluid supply unit 3 may be supplied into the drying chamber housing 9. For example, the gas G supplied from the gas tank 51 (see FIG. 4) of the gas supply unit 5 may be converted into the supercritical fluid SCF in the supercritical fluid supply unit 3, and then, the supercritical fluid SCF may move to the upper inlet UI through the supercritical fluid line 37 and the supply line 61. Liquid on the substrate W may be removed by the supercritical fluid SCF supplied in the drying space 9*h*. For example, the wetting solution coated on the substrate W in the wet chamber B (see FIG. 7) may be dried by the supercritical fluid SCF in the drying chamber A. More particularly, the supercritical fluid SCF at high pressure may drive or blow the liquid on the substrate W away, and thus the substrate W may be dried.

The supplying of the supercritical fluid SCF may be performed after the supplying of the gas G is started. For example, the supplying of the supercritical fluid SCF may be started after the pressure in the drying chamber A reaches the first pressure. When the supplying of the supercritical fluid SCF is started, the supplying of the gas G may be stopped. More particularly, when the pressure in the drying chamber A exceeds the first pressure, the supplying of the gas G may be stopped. In other words, the supplying of the gas G into the drying chamber A may be performed only until the pressure in the drying chamber A reaches the first pressure. When the pressure in the drying chamber A exceeds the first pressure, only the supercritical fluid SCF may be supplied. However, embodiments of the inventive concepts are not limited thereto, and in certain embodiments, the gas G may be continuously supplied when the supercritical fluid SCF is supplied.

A supply flow rate of the supercritical fluid SCF may range from about 5 g/s to about 10 g/s. Thus, the pressure in the drying chamber A may continuously rise. For example, the pressure in the drying chamber A may linearly increase.

The supercritical fluid SCF may be supplied into the drying chamber A, and thus the drying space 9*h* may be filled with the supercritical fluid SCF. Thus, the pressure in the drying chamber A may rise. The supercritical fluid SCF may increase the pressure of the drying space 9*h* to a second pressure. In other words, the supercritical fluid SCF may be continuously supplied into the drying chamber A until the pressure in the drying chamber A reaches the second pressure. The second pressure may be greater than the first pressure. For example, the second pressure may range from about 20 bar to about 160 bar. More particularly, the second pressure may be about 150 bar. In other words, the supercritical fluid SCF may be continuously supplied into the drying space 9*h* until the pressure in the drying chamber A is about 150 bar.

In some embodiments, a portion of the supercritical fluid SCF of the drying space 9*h* may be released through the lower outlet LE while the supercritical fluid SCF is supplied from the supercritical fluid supply unit 3. The amount of the supercritical fluid SCF released through the lower outlet LE may be less than the amount of the supercritical fluid SCF supplied from the supercritical fluid supply unit 3. Thus, the pressure in the drying chamber A may continuously rise. However, embodiments of the inventive concepts are not limited thereto, and in certain embodiments, the supercritical fluid SCF of the drying space 9*h* may not be released while the supercritical fluid SCF is supplied from the supercritical fluid supply unit 3.

The releasing of the fluid of the drying chamber (S323) may include releasing the supercritical fluid SCF of the drying space 9*h* until the pressure in the drying chamber A is a third pressure, after the pressure in the drying chamber A reaches the second pressure. The third pressure may be lower than the second pressure. The third pressure may be higher than the first pressure. For example, the third pressure may range from about 60 bar to about 100 bar. The supercritical fluid SCF may be released to the exhaust tank ET through the lower outlet LE.

In the releasing of the fluid of the drying chamber (S323), the supercritical fluid SCF may be continuously supplied from the supercritical fluid supply unit 3. The amount of the released supercritical fluid SCF may be greater than the amount of the supercritical fluid SCF supplied from the supercritical fluid supply unit 3. Thus, the pressure in the drying chamber A may be reduced. However, embodiments of the inventive concepts are not limited thereto, and in certain embodiments, the supplying of the supercritical fluid SCF from the supercritical fluid supply unit 3 may be stopped in the releasing of the fluid of the drying chamber (S323).

Referring back to FIGS. 11 and 5, the supplying of the supercritical fluid into the drying chamber (S322) may be performed again after the releasing of the fluid of the drying chamber (S323). More particularly, after the pressure in the drying chamber A reaches the third pressure, the supercritical fluid SCF may be supplied into the drying chamber A to bring the pressure in the drying chamber A back to the second pressure. Thus, the pressure in the drying chamber A may rise again.

In some embodiments, the supplying of the supercritical fluid into the drying chamber (S322) and the releasing of the fluid of the drying chamber (S323) may be alternately and repeatedly performed. Thus, the pressure in the drying chamber A may be continuously changed between the second pressure and the third pressure.

Figure 13:
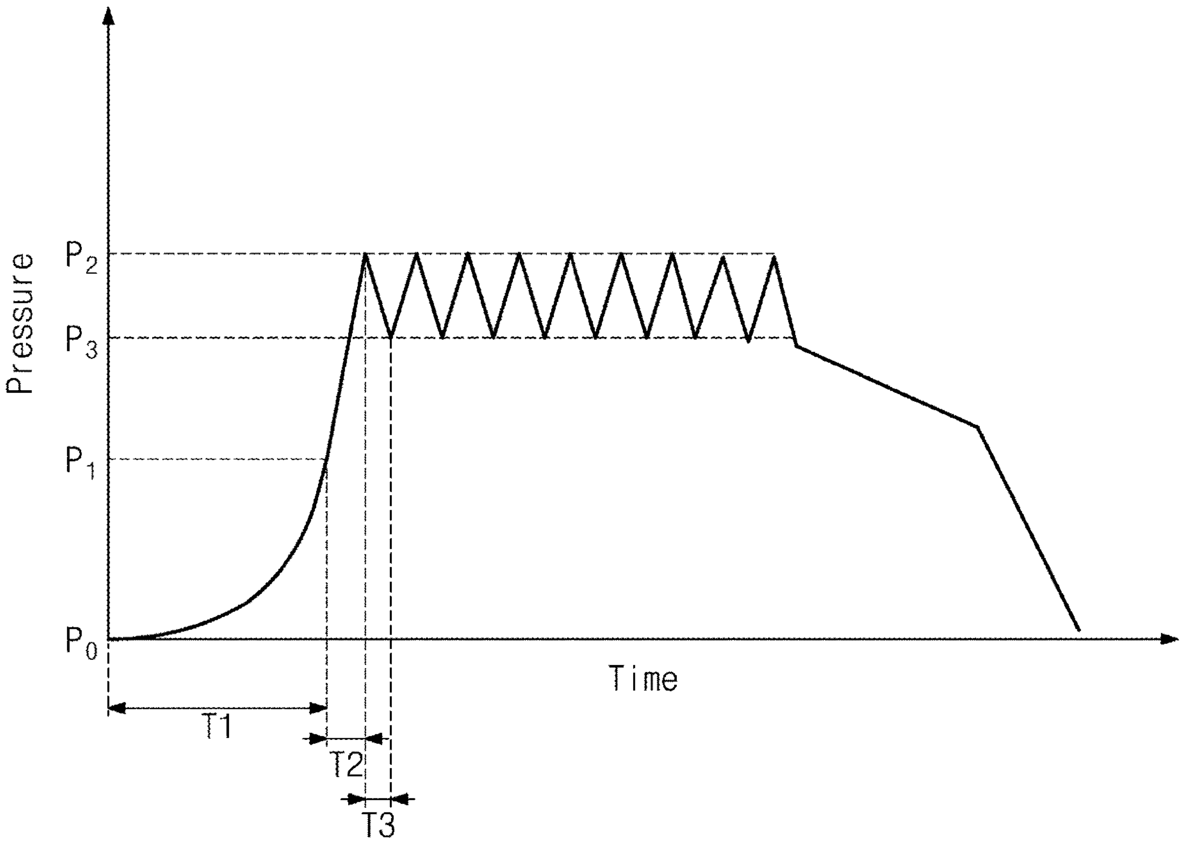
FIG. 13 is a graph showing a pressure in a drying chamber when performing the method of processing a substrate according to some embodiments of the inventive concepts.

FIG. 13 is a graph showing a pressure in a drying chamber when performing the method of processing a substrate according to some embodiments of the inventive concepts.

Referring to FIG. 13, a horizontal axis of the graph may mean a time elapsed during the supplying of the fluid into the drying chamber (S32; see FIG. 5). A vertical axis of the graph may mean the pressure in the drying chamber A (see FIG. 12).

Referring to FIGS. 5, 11, 12 and 13, before the supplying of the gas into the drying chamber (S321) is started, the pressure in the drying chamber A may be an initial pressure $P_0$. For example, the initial pressure $P_0$ may be substantially equal or similar to the atmospheric pressure. Alternatively, the initial pressure $P_0$ may be close to 0 bar, and thus the drying space 9*h* may be in a substantial vacuum state.

When the supplying of the gas into the drying chamber (S321) is performed, the pressure of the drying chamber A may increase from the initial pressure $P_0$ to a first pressure $P_1$. The pressure increase from the initial pressure $P_0$ to the first pressure $P_1$ may be continuously performed. This interval may be referred to as a first interval T1.

When the supplying of the supercritical fluid into the drying chamber (S322) is performed, the pressure of the drying chamber A may increase from the first pressure $P_1$ to a second pressure $P_2$. The pressure increase from the first pressure $P_1$ to the second pressure $P_2$ may be continuously performed. This interval may be referred to as a second interval T2.

When the releasing of the fluid of the drying chamber (S323) is performed, the pressure of the drying chamber A may decrease from the second pressure $P_2$ to a third pressure $P_3$. The pressure decrease from the second pressure $P_2$ to the third pressure $P_3$ may be continuously performed. This interval may be referred to as a third interval T3. Thereafter, the second interval T2 and the third interval T3 may be alternately and repeatedly performed. After the second interval T2 and the third interval T3 are repeatedly performed a certain number of times, the fluid in the drying chamber A may be released to decrease the pressure in the drying chamber A to the initial pressure $P_0$. Thereafter, the substrate W may be taken out of the drying chamber A.

According to the substrate processing apparatus and the method of processing a substrate using the same according to the embodiments of the inventive concepts, the gas, not the supercritical fluid, may be supplied in a low-pressure interval when the fluid is supplied into the drying chamber. Thus, it is possible to prevent discontinuous flow of the fluid, which may occur in a process of supplying the high-pressure supercritical fluid into the low-pressure drying chamber. In other words, the fluid supplied into the drying chamber may be supplied with a continuous rate distribution. Thus, the pressure in the drying chamber may continuously increase. In other words, the pressure in the drying chamber may be easily controlled using both the gas and the supercritical fluid.

According to the substrate processing apparatus and the method of processing a substrate using the same according to the embodiments of the inventive concepts, since the fluid supplied into the drying chamber has the continuous rate distribution, it is possible to prevent the fluid from colliding with the substrate at a high speed. In addition, it is possible to prevent the flow of the fluid supplied onto the substrate from being interrupted. As a result, damage of the substrate may be prevented. In addition, cleaning efficiency on the substrate may be improved.

Figure 14:
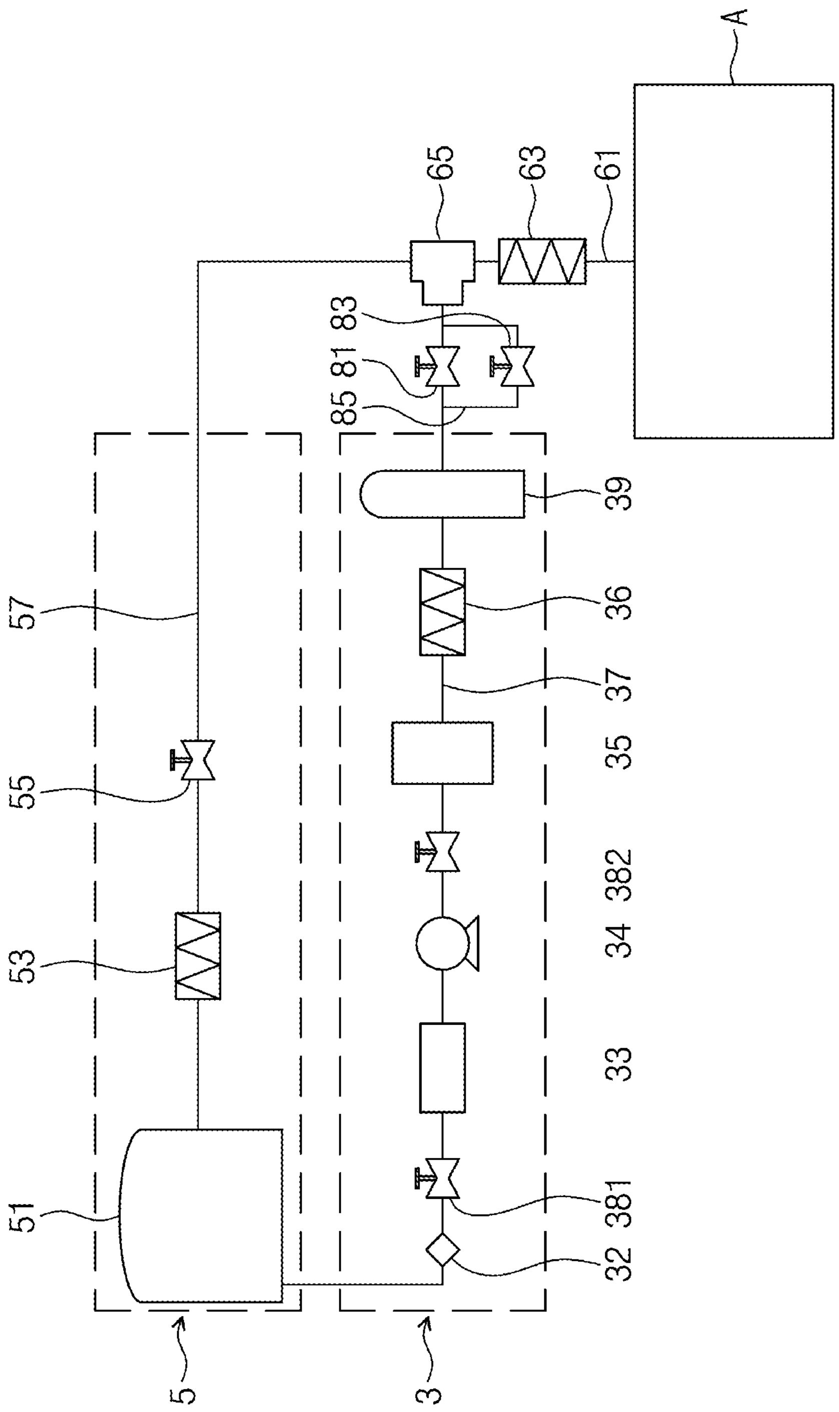
FIG. 14 is a schematic view illustrating a gas supply unit and a supercritical fluid supply unit according to some embodiments of the inventive concepts.

FIG. 14 is a schematic view illustrating a gas supply unit and a supercritical fluid supply unit according to some embodiments of the inventive concepts.

Hereinafter, the descriptions of substantially the same or similar features as mentioned with reference to FIGS. 1 to 13 will be omitted for the purpose of ease and convenience in explanation.

Referring to FIG. 14, a supercritical valve may be provided in plurality. For example, a first supercritical valve 81 and a second supercritical valve 83 may be provided. The second supercritical valve 83 may be disposed on a bypass line 85. The first supercritical valve 81 may be a low-pressure valve. The second supercritical valve 83 may be a high-pressure valve. In an early stage of the supplying of the supercritical fluid, the second supercritical valve 83 may be closed, and the first supercritical valve 81 may be open. Thus, the supercritical fluid may be smoothly supplied in a medium-pressure range. In a later stage of the supplying of the supercritical fluid, the first supercritical valve 81 may be closed, and the second supercritical valve 83 may be open. Thus, the supercritical fluid may be smoothly supplied in a high-pressure range.

Figure 15:
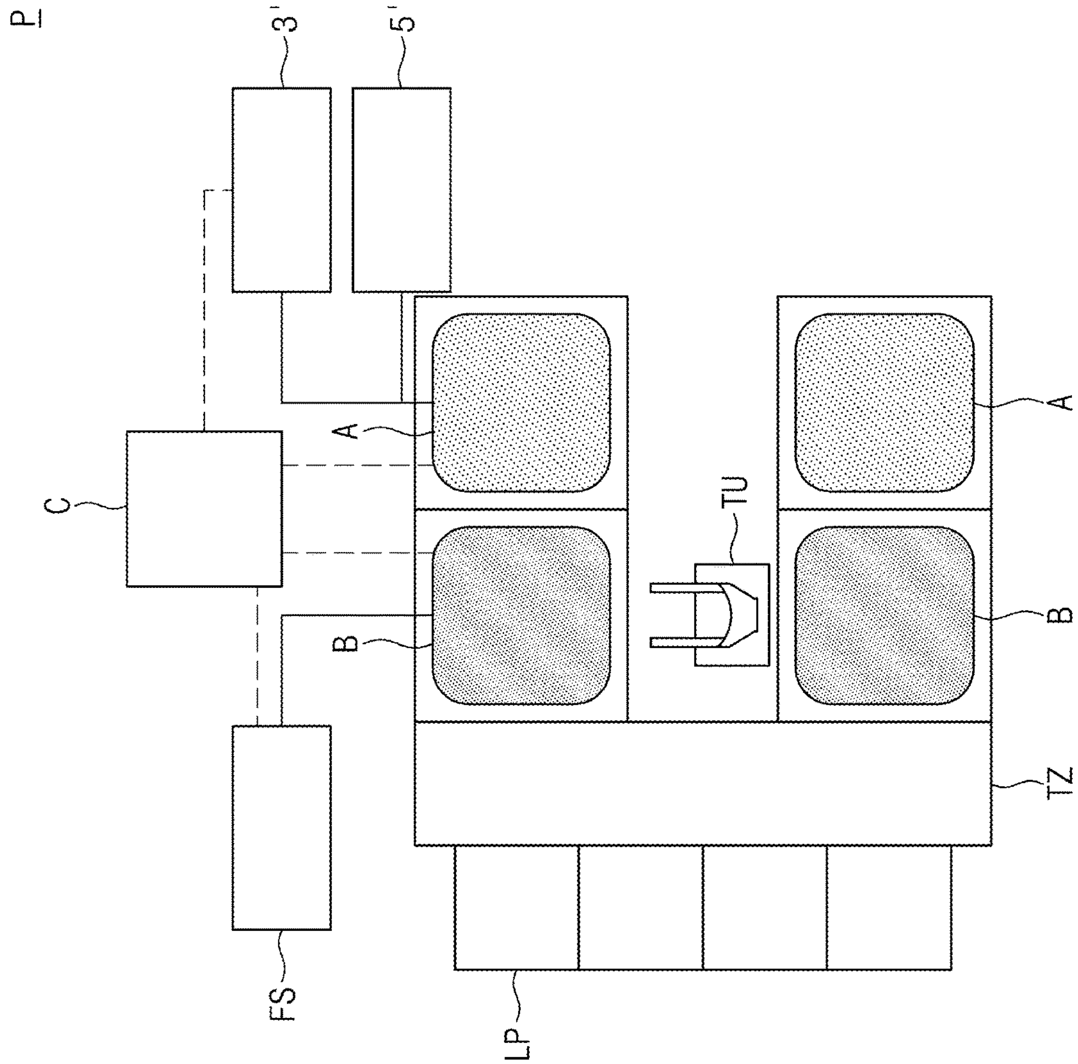
FIG. 15 is a schematic view illustrating a substrate processing apparatus according to some embodiments of the inventive concepts.

FIG. 15 is a schematic view illustrating a substrate processing apparatus according to some embodiments of the inventive concepts.

Hereinafter, the descriptions of substantially the same or similar features as mentioned with reference to FIGS. 1 to 14 will be omitted for the purpose of ease and convenience in explanation.

Referring to FIG. 15, a substrate processing apparatus P may be provided. However, unlike FIG. 1, a supercritical fluid supply unit 3' may not be connected to a gas supply unit 5' in the substrate processing apparatus P of FIG. 15. The supercritical fluid supply unit 3' may be supplied with liquid and/or a gas from another component to generate the supercritical fluid (i.e., to convert the gas into the supercritical fluid).

According to the substrate processing apparatus and the method of processing a substrate using the same in the inventive concepts, the pressure in the drying chamber may be easily controlled.

According to the substrate processing apparatus and the method of processing a substrate using the same in the inventive concepts, the pressure in the drying chamber may be continuously increased.

According to the substrate processing apparatus and the method of processing a substrate using the same in the inventive concepts, damage of the substrate may be prevented.

According to the substrate processing apparatus and the method of processing a substrate using the same in the inventive concepts, cleaning efficiency of the substrate may be improved.

While the embodiments of the inventive concepts have been particularly shown and described, it will be understood by one of ordinary skill in the art that variations in form and detail may be made therein without departing from the spirit and scope of the attached claims.

What is claimed is:

1. A method of processing a substrate, the method comprising:

disposing the substrate in a drying chamber; and supplying a fluid into the drying chamber in which the substrate is disposed, wherein the supplying of the fluid into the drying chamber comprises:

supplying, after the disposing of the substrate in the drying chamber, a gas into the drying chamber; and supplying, after the supplying of the gas into the drying chamber, a supercritical fluid of the gas into the drying chamber.

2. The method of claim 1, wherein the supplying of the gas into the drying chamber is performed until a pressure in the drying chamber reaches a first pressure, and wherein the supplying of the supercritical fluid into the drying chamber is performed until the pressure in the drying chamber reaches a second pressure higher than the first pressure.

3. The method of claim 2, wherein the first pressure is selected from a range of from about 10 bar to about 80 bar, and wherein the second pressure is selected from a range of from about 20 bar to about 160 bar.

4. The method of claim 2, wherein the supplying of the fluid into the drying chamber further comprises:

releasing the fluid in the drying chamber to adjust the pressure in the drying chamber from the second pressure to a third pressure, after the pressure in the drying chamber reaches the second pressure, and wherein the third pressure is lower than the second pressure and is higher than the first pressure.

5. The method of claim 4, wherein the third pressure is selected from a range of from about 60 bar to about 100 bar.

6. The method of claim 4, wherein the supplying of the fluid into the drying chamber further comprises:

supplying the supercritical fluid into the drying chamber to adjust the pressure in the drying chamber from the third pressure to the second pressure, after the releasing of the fluid of the drying chamber to adjust the pressure in the drying chamber to the third pressure.

7. The method of claim 2, wherein the supplying of the supercritical fluid into the drying chamber is started after the pressure in the drying chamber reaches the first pressure.

8. A method of processing a substrate, the method comprising:

wet-processing the substrate; and dry-processing the substrate wet-processed, wherein the dry-processing of the substrate comprises:

disposing the substrate in a drying chamber;

supplying, after the disposing of the substrate in the drying chamber, a gas into the drying chamber to increase a pressure in the drying chamber to a first pressure; and supplying, after the supplying of the gas into the drying chamber, a supercritical fluid of the gas into the drying chamber after the pressure in the drying chamber reaches the first pressure.

9. The method of claim 8, wherein the supplying of the gas into the drying chamber comprises:

supplying the gas, supplied from a gas tank of a gas supply unit, into the drying chamber.

10. The method of claim 9, wherein the gas includes a $CO_2$ gas.

11. The method of claim 9, wherein the supplying of the supercritical fluid into the drying chamber comprises:

supplying the supercritical fluid, supplied from a supercritical fluid supply unit, into the drying chamber.

12. The method of claim 11, wherein the supercritical fluid includes a $CO_2$ supercritical fluid.

13. The method of claim 11, wherein the supplying of the supercritical fluid includes:

receiving the gas from the gas tank; and converting the gas into the supercritical fluid.

14. The method of claim 9, wherein the supplying of the gas into the drying chamber further comprises:

heating the gas supplied from the gas tank into the drying chamber.

15. The method of claim 8, wherein the first pressure is selected from a range of from about 20 bar to about 80 bar.

16. The method of claim 8, wherein the wet-processing of the substrate comprises:

disposing the substrate in a wet chamber; and supplying a wetting solution onto the substrate disposed in the wet chamber.

17. A substrate processing apparatus comprising:

a drying chamber;

a gas supply unit including a gas tank configured to store a gas, wherein the gas supply unit is configured to supply the gas into the drying chamber; and a supercritical fluid supply unit connected to the gas tank and configured to supply a supercritical fluid of the gas into the drying chamber, wherein the drying chamber comprises:

a drying chamber housing providing a drying space; and a drying chuck in the drying chamber housing.

18. The substrate processing apparatus of claim 17, wherein the gas supply unit further comprises:

a gas line configured to transfer the gas supplied from the gas tank into the drying chamber.

19. The substrate processing apparatus of claim 18, wherein the gas supply unit further comprises:

a gas heater on the gas line.

20. The substrate processing apparatus of claim 18, further comprising:

a supply line connecting the gas line to the drying chamber.

* * * * *